United States Patent [19]

Mariner

[11] Patent Number: 5,410,631
[45] Date of Patent: Apr. 25, 1995

[54] CLAMP ASSEMBLY FOR A VAPORIZATION BOAT

[75] Inventor: John T. Mariner, Avon Lake, Ohio

[73] Assignee: Advanced Ceramics Corporation, Lakewood, Ohio

[21] Appl. No.: 119,996

[22] Filed: Sep. 10, 1993

[51] Int. Cl.⁶ ............................................. C23C 14/26
[52] U.S. Cl. .................................. 392/389; 392/390; 439/804
[58] Field of Search ................. 392/389, 390; 118/726, 118/727; 439/785, 804, 927, 86, 87, 886

[56] References Cited

U.S. PATENT DOCUMENTS

| | | | |
|---|---|---|---|
| 2,969,448 | 1/1961 | Alexander | 392/389 |
| 2,996,418 | 8/1961 | Bleil | 118/726 |
| 3,117,887 | 1/1964 | Shepard et al. | 392/389 |
| 3,200,368 | 8/1965 | Stekly et al. | 439/785 |
| 3,231,846 | 1/1966 | Radke | 392/389 |
| 3,404,061 | 10/1968 | Shane . | |
| 3,537,886 | 11/1970 | Rively et al. | 392/389 |
| 3,617,348 | 11/1971 | Kelley et al. | 118/726 |
| 3,637,980 | 1/1972 | Fox et al. | 392/389 |
| 4,264,803 | 4/1981 | Shinko . | |
| 5,107,791 | 4/1992 | Hirokawa et al. | 118/726 |
| 5,182,567 | 1/1993 | Wilder | 392/389 |

Primary Examiner—Teresa J. Walberg
Attorney, Agent, or Firm—Michael N. Meller

[57] ABSTRACT

A clamp assembly includes a clamp body of conductive material having a channel along one surface to receive the end of a vaporization boat. The channel has a depth which is greater than the thickness of the end of the vaporization boat such that a gap is formed between the end of the boat and the top of the channel. A metal member is fastened to the clamp body across the open top of the channel to form an enclosure for the end of the boat. Flexible graphite fills the gap and forms a compression fit upon fastening of the metal member to the clamp body.

9 Claims, 8 Drawing Sheets

"Working position"

"Loosely assembled"

"Working position"

CLAMP ASSEMBLY FOR A VAPORIZATION BOAT

FIELD OF INVENTION

This invention relates to a clamp assembly for a vaporization boat which is resistance heated to vacuum vaporize metals in the coating of product.

BACKGROUND OF THE INVENTION

Vacuum deposition is a common method for coating metals such as aluminum, copper, zinc, and tin onto various substrates of metal, glass and plastic. In the conventional vacuum deposition process a container is heated by electric resistance heating to vaporize metal in contact with the container. The container is commonly referred to as a "vaporization boat" or simply a "boat" and is connected in an electric circuit which a source of electrical power provides sufficient current flow directly through the boat to heat the boat to a temperature which will cause the metal in contact with the boat to vaporize. The electrical connection is accomplished using a clamp. The metal is vaporized in an evacuated atmosphere for coating a product which may be individually introduced into the evacuated chamber, or continuously fed through the chamber or, alternatively, may form part of the chamber itself. A wide variety of product is coated with metal using vapor deposition including, e.g., television picture tubes, automobile headlights, toys and the like.

Presently, most clamp systems are composed of a metal bar or bracket and a body assembly which are fastened about the ends of a boat using machine screws or bolts. Contact pressure on the boat is provided by tightening the bolts to draw the body and bar boat is provided by tightening the bolts to draw the body and bar assembly into tight engagement. To insure good electrical and mechanical contact the bolts are tightened aggressively so that there is little or no opportunity for the boat to move relative to the clamp. It has been discovered that this sets up a life degrading stress as a result of repeated thermal cycling of the boat in normal operation. In each cycle of operation the boat is resistance heated to a temperature to vaporize metal which causes the boat to expand. However upon cooldown at the end of each cycle the boat contracts. The present clamping mechanism does not allow for relative movement between the boat and the clamp.

SUMMARY OF THE INVENTION

A clamp assembly has been discovered in accordance with the present invention which will allow for thermal expansion while maintaining a rigid electrical connection with the boat as well as to compensate for misalignment in clamp installation. The clamp assembly of the present invention is adapted to connect each end of a vaporization boat to an electric source of power, with each end of said vaporization boat having a cross sectional geometry of predetermined thickness, and comprises:

a clamp body composed of conductive material having a channel extending across one surface thereof with an open top for receiving one end of said vaporization boat, a metal member;

means for fastening said metal member to said clamp body across said open top of said channel with said metal member and said channel forming an enclosure for said one end of the boat a gap is formed between said one end and said open top upon insertion of said one end in said channel; and means consisting of flexible graphite for filling said gap and for forming a compression fit upon fastening of said metal member to said clamp body.

BRIEF DESCRIPTION OF THE DRAWINGS

Other advantages of the present invention will become apparent from the following detailed description of the invention when read in conjunction with the accompanying drawings of which:

FIG. 3A is a enlarged top view of the clamp body of FIG. 3 with the vaporization boat removed to illustrate the preferred geometry for the lateral sides of the clamp body;

FIG, 6 is an illustrative isometric drawing of an alternative embodiment of the clamp assembly of the present invention shown loosely assembled.

DETAILED DESCRIPTION OF THE INVENTION

Figure 1:
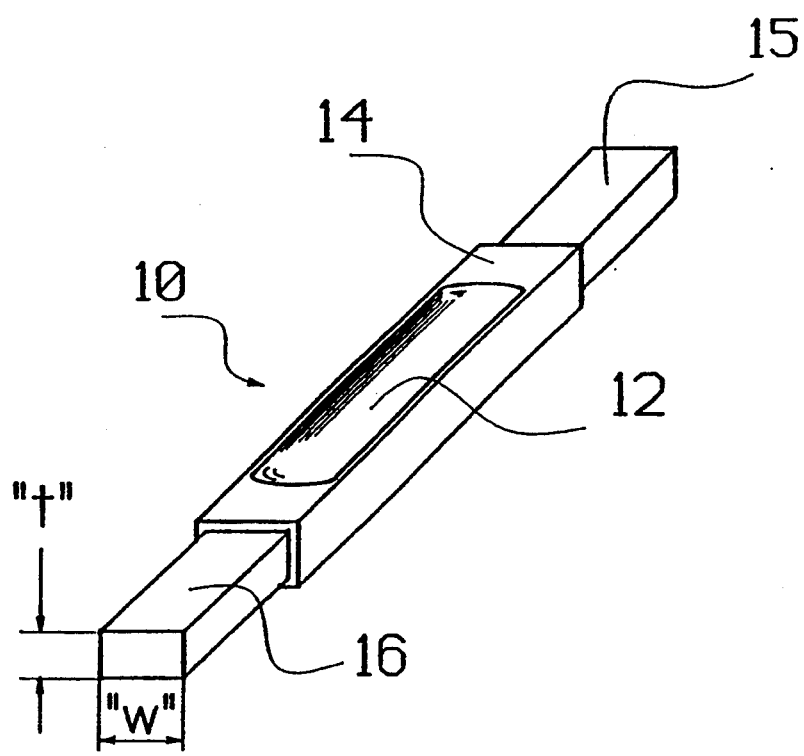
FIG. 1 is an isometric view of a typical vaporization boat for use in a vacuum deposition process.

Resistance heated vaporization boats in use today are commonly made of intermetallic composite materials such as titanium diboride with boron nitride or titanium diboride with boron nitride and aluminum nitride. An alternative composition for a vaporization boat for which the clamp assembly of the present invention is particularly useful is a graphite body with a coating of pyrolytic born nitride as taught in U.S. Pat. No. 4,264,803 the disclosure of which is herein incorporated by reference. Vaporization boats of the resistance type require a precise shape to match the resistance circuit. They are usually made long and narrow as is shown in FIG. 1 with a cavity or depression 12 machined into the boat 10 on at least one surface 14. The ends 15 and 16 of the boat 10 are machined to a desired width "w" and thickness "t". The boat 10 is formed from a block of graphite preferably of high density and high strength and is coated with a thin layer of pyrolytic boron nitride. The process for coating boron nitride is conventional and briefly involves introducing vapors of ammonia and a gaseous boron halide in a suitable ratio into a heated furnace reactor containing the graphite body with the furnace maintained at a controlled temperature of between 1800° C. to 2200° C. The coating of boron nitride which is usually no thicker than 0.030 inches fully encapsulates the graphite body except for the ends 15 and 16 where the coating is machined off to expose the graphite for making an electrical connection with the clamp assembly.

Figure 2:
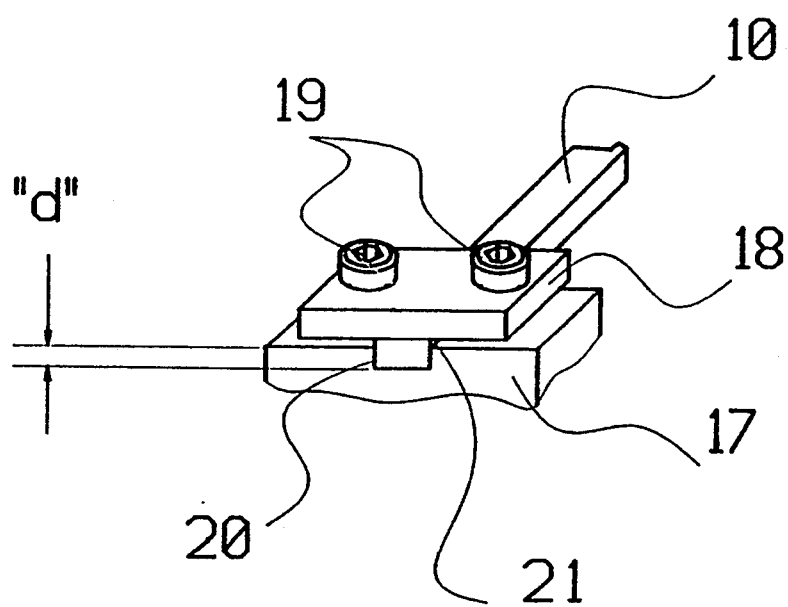
FIG. 2 is an isometric drawing illustrative of a prior art clamping arrangement for clamping the end of a vaporization boat.

The typical clamping arrangement for clamping the ends of a vaporization boat to an electric circuit for supplying current to the vaporization boat is shown in FIG. 2. The prior art clamp system includes a clamp body 17 for each end of the vaporization boat and an accompanying metal bar 18 which is bolted to each clamp body 17 using machine bolts 19. The clamp body 17 has a grooved channel 20 with an open top 21 into which one of the ends 15 or 16 of the vaporization boat is mounted. The geometry of the channel 20 conforms to the cross sectional geometry of the corresponding end 15 or 16 of the vaporization boat 10. The channel 20 has a width "w" which is dimensioned to be essentially equal to the width "w" of the end 15 or 16 of the vaporization boat 10 so as to form a tight fit. The depth "d" of the channel 20 is deliberately dimensioned to be shorter than the thickness "t" of the ends of the vaporization boat 10 to insure that a full clamping load will be brought to bear on the vaporization boat 10 upon tightening the machine bolts 19. This is intended to maximize mechanical and electrical contact with the ends 15 and 16 of the vaporization boat 10. The bolts 19 are aggressively tightened to cause the boat 10 to be pinched between the engaging surfaces.

Figure 3:
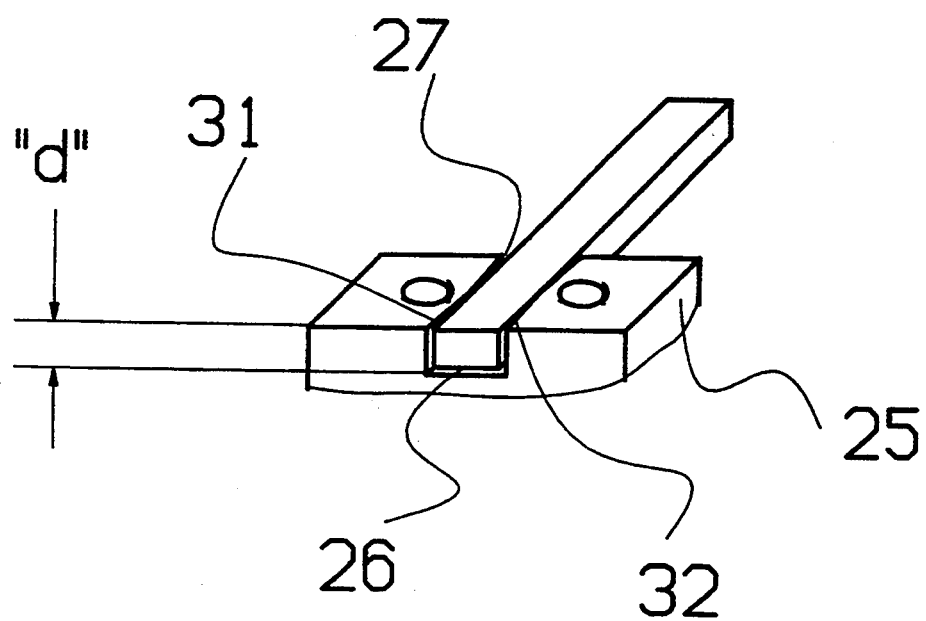
FIG. 3 is a diagrammatic drawing showing one end of a vaporization boat inserted into the clamp body in the clamp assembly of the present invention.
Figure 3:
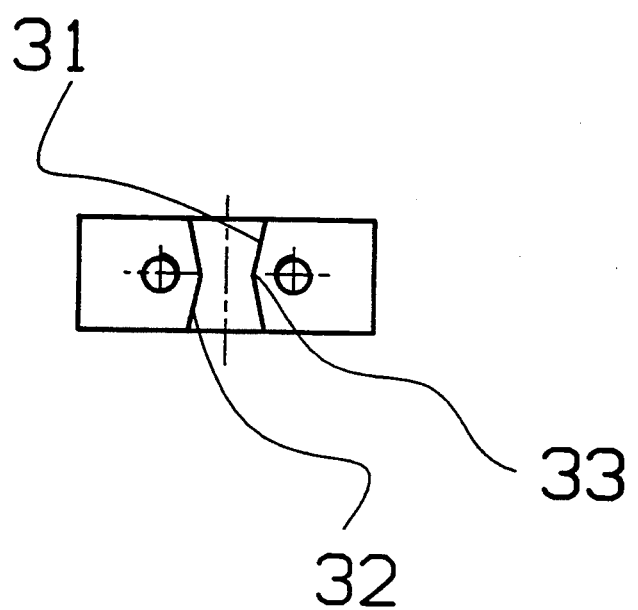
Figure 4:
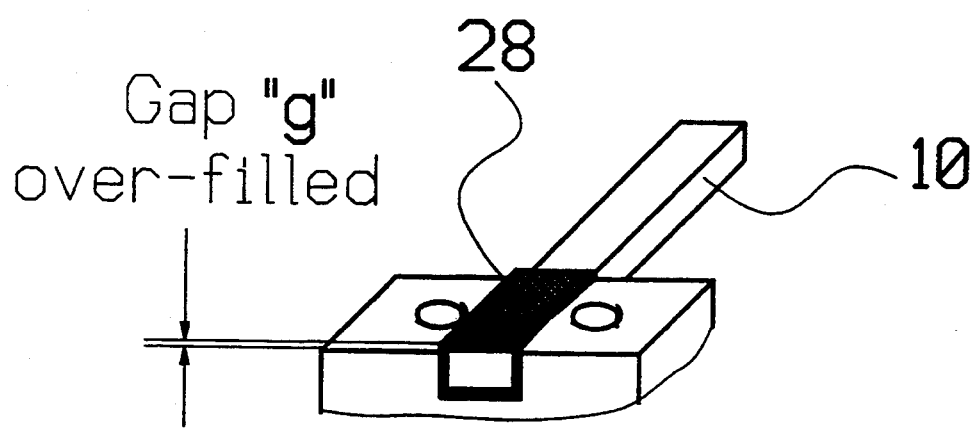
FIG. 4 is a diagrammatic drawing similar to FIG. 3 showing the inserted end of the vaporization boat wrapped in flexible graphite in accordance with the present invention.
Figure 5:
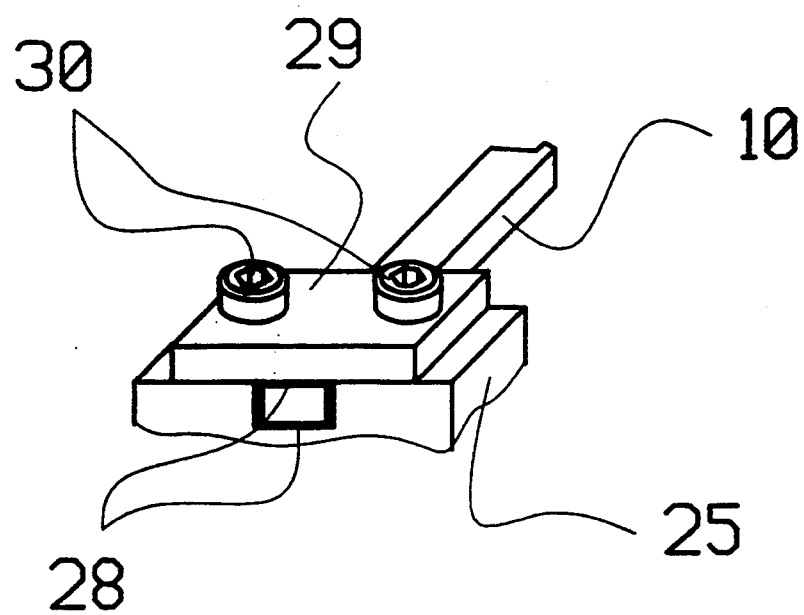
FIG. 5 is an illustrative isometric view of the clamping arrangement of the present invention for clamping the end of a vaporization boat in accordance with the present invention.

The clamp assembly of the present invention is shown in FIGS. 3 to 7 inclusive and comprises a clamp body 25 machined from solid stock into any desirable geometry to satisfy the configuration for mounting the vaporization boat 10. The clamp body 25 contains a channel 26 having an open top 27 for receiving one of the ends 15 or 16 of the vaporization boat 10. The channel 26 is designed with distinct differences from its counterpart in the prior art clamp body 17 of FIG. 2. In the first instance the depth "d" of the channel 26 should be greater than the thickness "t" of the ends 15 and 16 of the vaporization boat 10 to leave a gap "g" equal to "d" minus "t" between the boat 10 and the open top 27 upon insertion of one end 15 or 16 of the boat 10 into the channel 26. The gap "g" as shown in FIG. 4 is filled with flexible graphite 28 to a level at least coinciding with the open top 27 of the channel 26 and preferably to a level extending above the open top 27 to insure a compression fit upon attachment of the metal bar 29 across the open top 27 of the channel 26 using bolts 30 as shown in FIG. 5. Flexible graphite is a commercially available product which is made from particles of graphite intercalated in an acid solution and exfoliated as taught in U.S. Pat. No. 3,404,061. Flexible graphite may be purchased in granular form or in strip form or with the strip wound into a tape. A flexible graphite tape is preferred for use in accordance with the present invention.

In the preferred practice of the invention a flexible graphite tape is wrapped around each end 15 and 16 of the vaporization boat 10 as shown in FIG. 4 or simply placed on the top and bottom sides of each end thereof to fill up the gap formed in each channel 26 after inserting the ends of the vaporization boat into respective clamp bodies 25. The tape thickness will control the number of wraps or strips of flexible tape 28 required to reach an appropriate thickness of tape. A controlled gap height of 0.020 inches with a full wrap of 0.015 inches, of 70 pounds per cubic foot density flexible graphite tape has been demonstrated to work well. A full wrap gives two layers (top and bottom) for a total of 0.030 inches. Different density flexible graphite materials may be used with the density selected to provide the desired compression.

Another feature of the present invention resides in the design of the channel 26 of the clamp body 25 as shown in FIGS. 3 and 3A respectively. In this arrangement the lateral sides 31 and 32 of the channel 26 are countered to form an hourglass shape (FIG. 3A) with the center 33 of each lateral side measured along the length of the clamp body 25 projecting outwardly to engage the end 15 or 16 of the vaporization boat 10. The lateral sides 31 and 32 should form an included angle with a vertical plane extending through the center 33 of no more than about 5 degrees and preferably no more than about 3 degrees. Although this arrangement has been shown to provide relief for lateral movement of the vaporization boat it is not essential to the practice of the present invention.

Figure 6:
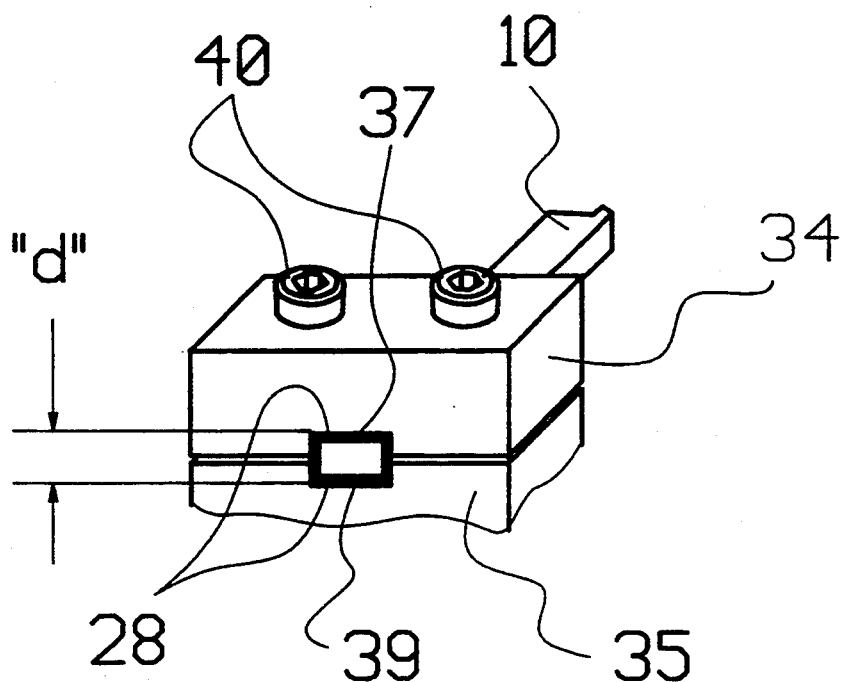
Figure 7:
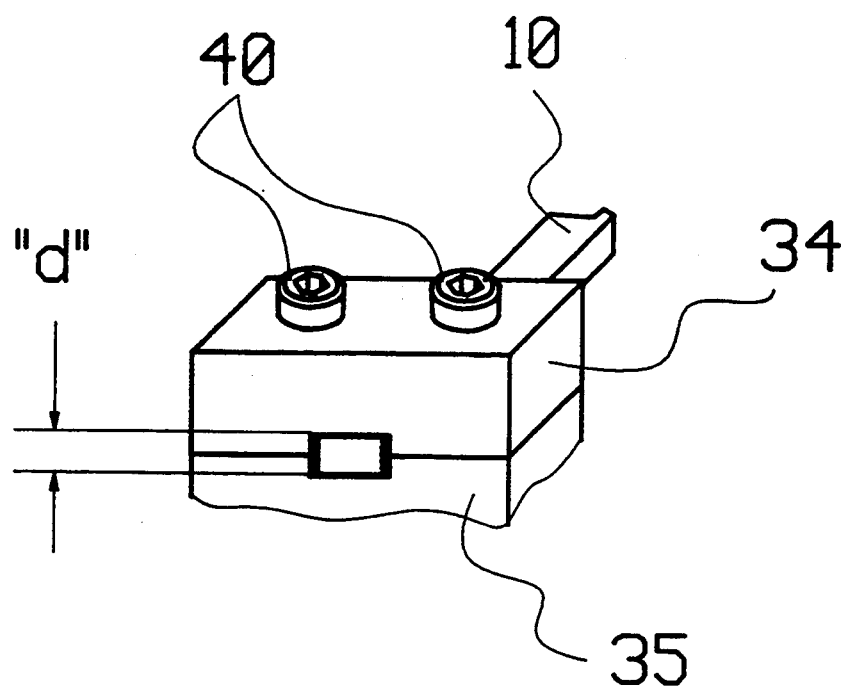
FIG. 7 is an isometric drawing of the clamp assembly of FIG. 6 shown in a working position with the members of the assembly tightly assembled.

Another embodiment of the present invention is shown in FIGS. 6 and 7 respectively. In this embodiment the upper member 34 is used for fastening the ends of the vaporization boat 10 to the clamp body 35 and contains a recessed section or channel 37 which conforms to the channel 39 formed in the clamp body 35 such that upon assembly the two channels 35 and 37 complement one another to form an enclosure for the ends of the vaporization boat. The depth "d" of the two channels forming the enclosure should equal the depth "d" in FIG. 3 thereby creating a gap "g" equal to "d" minus "t" as in the FIG. 3 arrangement. The ends of the boat 10 are wrapped with flexible graphite 28 as in the embodiment of FIG. 3. Upon tightening the bolts 40 the flexible graphite 28 is compressed into the working position of FIG. 7 to establish a solid electrical contact between the boat and the clamp body 35.

What we claim is:

1. A clamp assembly for connecting each end of a vaporization boat to a source of electrical power, with each end of said boat having a cross sectional geometry of predetermined thickness, comprising;

a clamp body composed of conductive material having a channel extending across one surface thereof with an open top for receiving one end of a vaporization boat, a metal member;

means for fastening said metal member to said clamp body across said open top of said channel with said metal member and said channel forming an enclosure for said one end of the boat, said enclosure having a depth greater than the thickness of said one end such that a gap is formed between said one end and said open top upon insertion of said one end in said channel; and electrically conductive flexible material filling said gap and forming a compression fit upon fastening of said metal member to said clamp body.

2. A clamp assembly as defined in claim 1 wherein said electrically conductive flexible material is flexible graphite.

3. A clamp assembly as defined in claim 2 wherein said channel has a depth greater than the thickness of said one end.

4. A clamp assembly as defined in claim 2 wherein said metal member has a recessed section which complements said channel to form said enclosure upon fastening said metal member to said clamp body.

5. A clamp assembly as defined in claim 3 wherein said flexible graphite is located on opposite sides of said one end of said vaporization boat in intimate contact with said metal member and said clamp body.

6. A clamp assembly as defined in claim 5 wherein the thickness of said one end with said flexible graphite is greater than the depth of said enclosure.

7. A clamp assembly as defined in claim 6 wherein said channel in said clamp body has contoured lateral sides forming an hourglass shape.

8. A clamp assembly as defined in claim 7 wherein each lateral side is recessed from a substantially symmetrical center located intermediate said channel to form an included angle with a vertical plane extending through said symmetrical center of no more than 5 degrees.

9. A clamp assembly as defined in claim 8 wherein said included angle is less than about 3 degrees.

* * * * *